(12) United States Patent
Darroman et al.

(10) Patent No.: US 8,878,483 B2
(45) Date of Patent: Nov. 4, 2014

(54) ELECTRONICS UNIT WITH CURRENT SENSING

(75) Inventors: Yann Darroman, Tarragona (ES); Josep Maria Roset Rubio, Tarragona (ES); Miguel Angel Acena, Tarragona (ES)

(73) Assignee: Lear Corporation, Southfield, MI (US)

( * ) Notice: Subject to any disclaimer, the term of this patent is extended or adjusted under 35 U.S.C. 154(b) by 839 days.

(21) Appl. No.: 13/006,569

(22) Filed: Jan. 14, 2011

(65) Prior Publication Data

US 2012/0181976 A1    Jul. 19, 2012

(51) Int. Cl.
*H02J 7/00* (2006.01)
*B60L 11/18* (2006.01)
*G01R 31/36* (2006.01)

(52) U.S. Cl.
CPC .............. *B60L 11/1816* (2013.01); *Y02T 90/14* (2013.01); *Y02T 10/7005* (2013.01); *G01R 31/3696* (2013.01); *Y02T 10/7088* (2013.01); *Y02T 90/121* (2013.01)
USPC ............ 320/107; 361/436; 361/600; 361/624

(58) Field of Classification Search
USPC ........................................................ 320/107
See application file for complete search history.

(56) References Cited

U.S. PATENT DOCUMENTS

| | | |
|---|---|---|
| 4,968,941 A | 11/1990 | Rogers |
| 5,196,987 A | 3/1993 | Webber et al. |
| 5,274,528 A | 12/1993 | Noschese et al. |
| 5,300,917 A | 4/1994 | Maue et al. |
| 5,351,165 A | 9/1994 | Hancock |
| 5,375,954 A | 12/1994 | Eguchi |
| 5,608,595 A | 3/1997 | Gourab et al. |
| 5,764,487 A | 6/1998 | Natsume |
| 5,831,425 A | 11/1998 | Ochiai |
| 6,079,920 A | 6/2000 | Dispenza |
| 6,181,590 B1 | 1/2001 | Yamane et al. |
| 6,327,165 B1 | 12/2001 | Yamane et al. |
| 6,351,113 B1 | 2/2002 | Becker et al. |
| 6,434,008 B1 | 8/2002 | Yamada et al. |
| 6,843,335 B2 | 1/2005 | Shirakawa et al. |
| 6,866,527 B2 | 3/2005 | Potega |
| 6,900,986 B2 | 5/2005 | Kimoto et al. |
| 6,903,457 B2 | 6/2005 | Nakajima et al. |
| 7,046,518 B2 | 5/2006 | Golightly et al. |

(Continued)

FOREIGN PATENT DOCUMENTS

| | | |
|---|---|---|
| CN | 2925014 Y | 7/2007 |
| CN | 101634688 | 1/2010 |

(Continued)

OTHER PUBLICATIONS

German Search Report for 10 2012 200 442.4 dated Dec. 17, 2013.

(Continued)

*Primary Examiner* — Edward Tso
*Assistant Examiner* — Johali Torres Ruiz
(74) *Attorney, Agent, or Firm* — Brooks Kushman P.C.

(57) ABSTRACT

A electronics unit operable to facilitate vehicle battery charging or other energy manipulation activities. The electronics unit may include a current sensor operable to determine an output current. The output current determination may be used as feedback or inputs to other electronics unit electronics, such as to facilitate battery charging related operations or other operations attendant to use of the electronics unit.

20 Claims, 7 Drawing Sheets

(56) References Cited

U.S. PATENT DOCUMENTS

| | | |
|---|---|---|
| 7,149,088 B2 | 12/2006 | Lin et al. |
| 7,289,329 B2 | 10/2007 | Chen et al. |
| 7,301,755 B2 | 11/2007 | Rodriguez et al. |
| 7,319,304 B2 * | 1/2008 | Veloo et al. ............... 320/134 |
| 7,436,672 B2 | 10/2008 | Ushijima et al. |
| 7,450,388 B2 * | 11/2008 | Beihoff et al. ............. 361/715 |
| 7,573,274 B2 | 8/2009 | Aratani |
| 8,305,034 B2 | 11/2012 | Rubio |
| 8,310,241 B2 * | 11/2012 | Schimmel ................. 324/437 |
| 8,441,827 B2 * | 5/2013 | Baker et al. ............... 363/141 |
| 2002/0034088 A1 | 3/2002 | Parkhill et al. |
| 2003/0011344 A1 | 1/2003 | Bertness et al. |
| 2003/0133259 A1 | 7/2003 | Meyer et al. |
| 2005/0039938 A1 | 2/2005 | Radosavljevic et al. |
| 2005/0051874 A1 | 3/2005 | Ushijima |
| 2005/0242769 A1 * | 11/2005 | Burt et al. ................. 320/107 |
| 2006/0086981 A1 | 4/2006 | Yamaguchi et al. |
| 2006/0092611 A1 | 5/2006 | Beihoff et al. |
| 2006/0202666 A1 | 9/2006 | Laig-Hoerstebrock et al. |
| 2007/0020120 A1 | 1/2007 | Oh et al. |
| 2007/0051974 A1 | 3/2007 | Azuma et al. |
| 2007/0052505 A1 | 3/2007 | Simpson |
| 2007/0071494 A1 | 3/2007 | Igarashi et al. |
| 2007/0204466 A1 | 9/2007 | Fisk |
| 2007/0246812 A1 | 10/2007 | Zhuang |
| 2007/0267997 A1 | 11/2007 | Kanazawa et al. |
| 2008/0030208 A1 | 2/2008 | Aratani |
| 2008/0266803 A1 | 10/2008 | Golhardt et al. |
| 2008/0316710 A1 | 12/2008 | Seto et al. |
| 2009/0002956 A1 | 1/2009 | Suwa et al. |
| 2009/0058334 A1 | 3/2009 | Yamamoto |
| 2009/0160048 A1 * | 6/2009 | Nakatsu et al. ............ 257/714 |
| 2009/0294195 A1 | 12/2009 | Otsuka et al. |
| 2010/0019733 A1 | 1/2010 | Rubio |
| 2010/0148298 A1 | 6/2010 | Takano et al. |
| 2011/0025143 A1 * | 2/2011 | Scott et al. ................. 310/52 |

FOREIGN PATENT DOCUMENTS

| | | |
|---|---|---|
| DE | 102006019911 | 11/2007 |
| DE | 60034903 | 1/2008 |
| DE | 102007034757 | 2/2008 |
| EP | 0867725 | 9/1998 |
| WO | 0233816 | 4/2002 |

OTHER PUBLICATIONS

Chinese Office Action for 201210008740.0 dated Nov. 27, 2013.

* cited by examiner

ELECTRONICS UNIT WITH CURRENT SENSING

TECHNICAL FIELD

The present invention relates to electronics units having current sensing capabilities, such as but not limited to electronics units operable within a vehicle.

BACKGROUND

An electronics unit may be configured to filter, rectify, invert, or otherwise manipulate electrical energy. The components comprising the electronics unit may be selected according to the manipulation provided by the electronics unit and the attendant power demands. Greater power demands are typically required of electronics units used to manipulate electrical energy at higher voltage levels due to increased current requirements. This can be problematic, for example, in fully or partially, electrically-driven vehicles, such as but not limited to electric vehicles (EV) and hybrid electric vehicles (HEVs), where a high voltage source may be used to electrically power a motor used to drive the vehicle.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION

Figure 1:
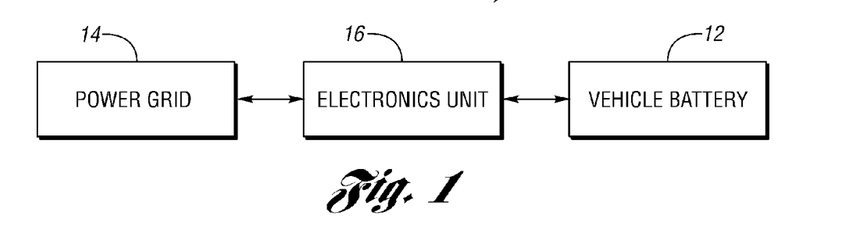
FIG. 1 illustrates a system for charging a vehicle battery in accordance with one non-limiting aspect of the present invention.

FIG. 1 illustrates a system 10 for charging a vehicle battery 12 with energy provided from a power grid 14 in accordance with one non-limiting aspect of the present invention. The power grid 14 may be a residential or other non-vehicle power source operable to provide AC current ab electronics unit 16 for rectification and use in DC charging of the vehicle battery 12. A cord (not shown) or other feature may be used to electrically connect the power grid 14 to the electronics unit 16 in the event the electronics unit 16 resides within the vehicle and/or the cord may be instead used to connect the electronics unit 16 to the vehicle battery 12, or a receptacle within the vehicle, in the event the electronics unit 16 does not reside within the vehicle, such as in the event the electronics unit 16 is part of a charging station.

The present invention is predominately described with respect to the electronics unit 16 being included within the vehicle and operable to rectify, invert, or otherwise process three-phase AC current for use in DC charging of the battery 12. The electronics unit 16 may be include as a module or other component of a larger battery charger (not shown) or battery charger system (not shown). This is done for exemplary purposes and without intending to limit the scope and contemplation of the present invention as the present invention fully contemplates the use of single-phase AC energy and charging the battery with AC or DC energy. The present invention also contemplates the energy source being a device within the vehicle, such as an alternator or generator, to permit use of the electronics unit in the absence of the power grid.

Figure 2:
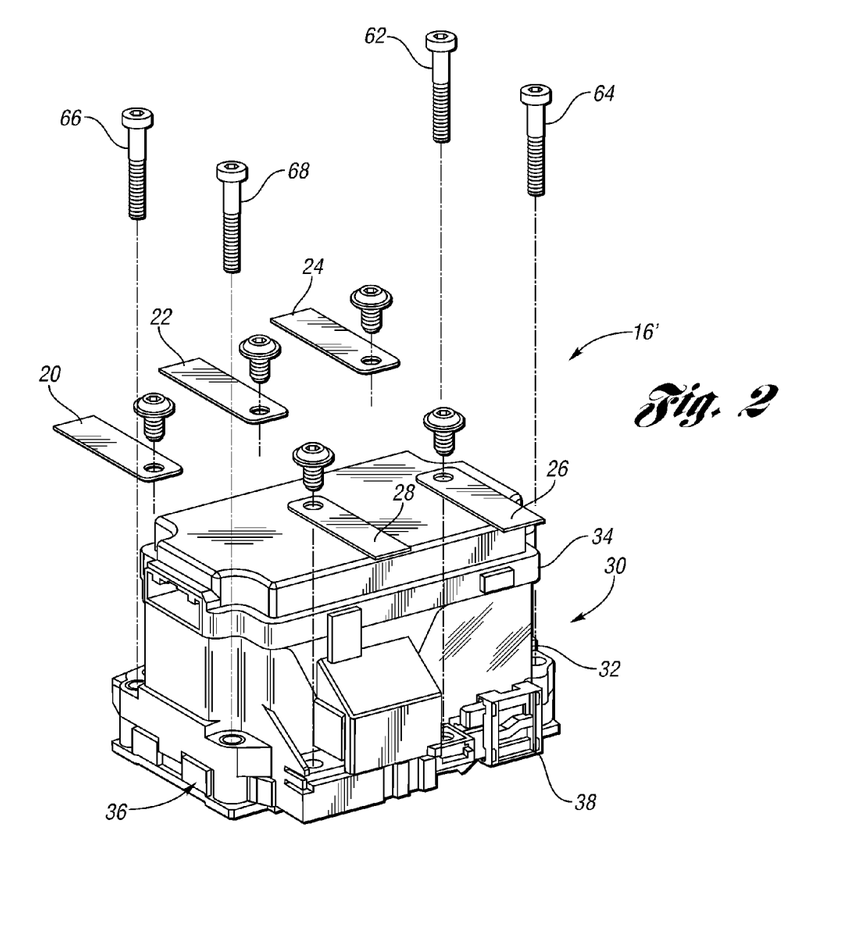
FIG. 2 illustrates a electronics unit in accordance with one non-limiting aspect of the present invention.

FIG. 2 illustrates a electronics unit 16' as contemplated by one non-limiting aspect of the present invention to process three-phase AC, received through first, second, and third input busbars 20, 22, 24 (four or more may be included if a ground or other connection is required for input and less may be also be included) to an DC output carried by first and second output busbars 26, 28 to the battery 12 or other vehicle load. The electronics unit 16' includes a housing 30 shown to be comprised of first and second portions 32, 34. The first portion 32 generally defines a footprint and side walls and the second portion 34 generally defines a cap or lid that fits over the first portion 32 to enclose the electronics and other items therein. The housing 30 is shown to be attached proximate a bottom of the first portion 32 to a rectifier rectifier 36. FIGS. 3a-3d illustrate a partial assembly view of the electronics unit 16' and the attachment of the bottom housing portion 32 to the rectifier 36 with a plurality of slide clips 38, 40, 42.

Figure 3A:
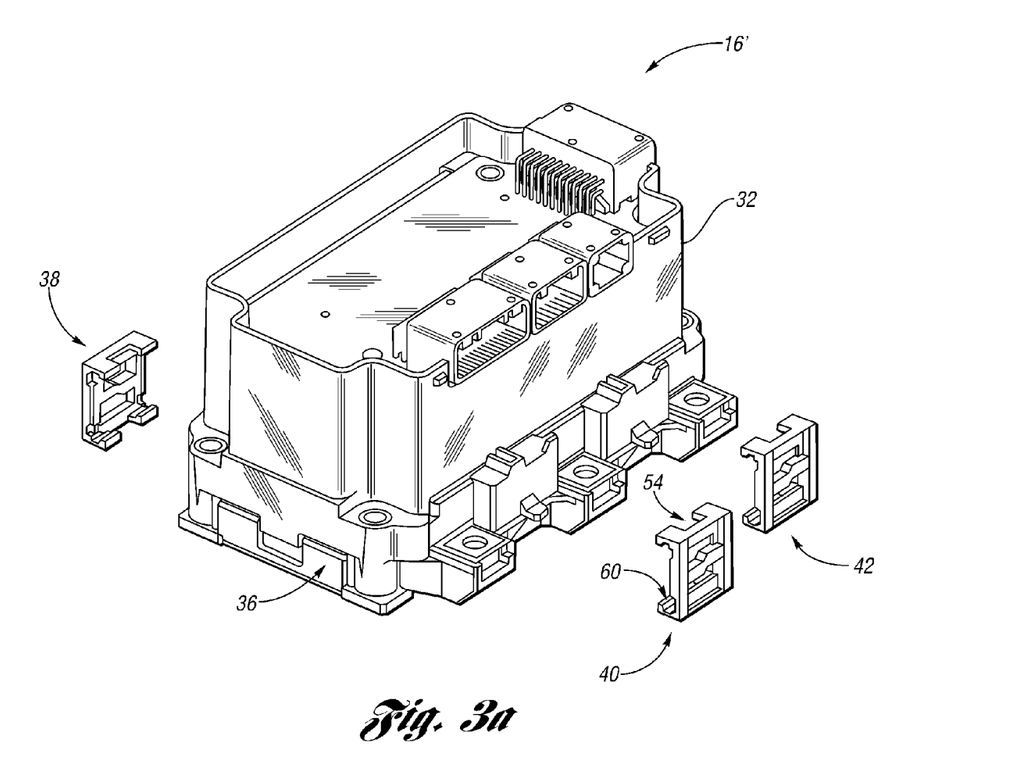
FIGS. 3a-3d and 4 illustrate a partial assembly view of the electronics unit.
Figure 3B:
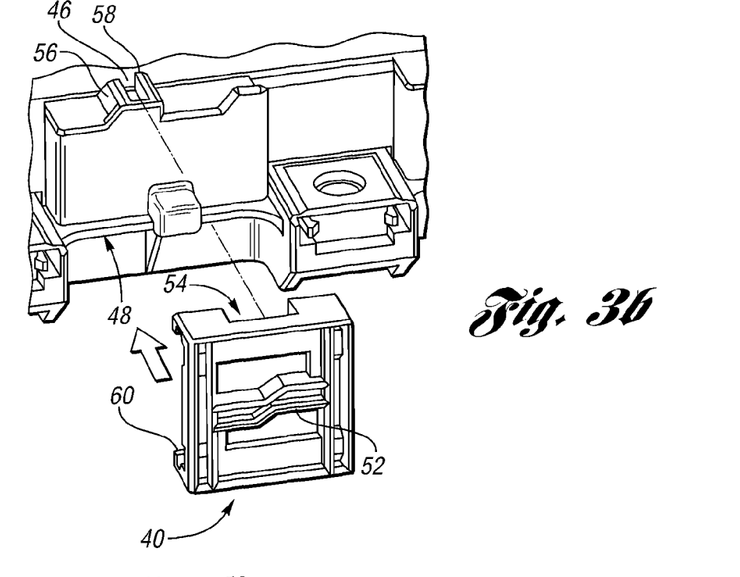
Figure 3C:
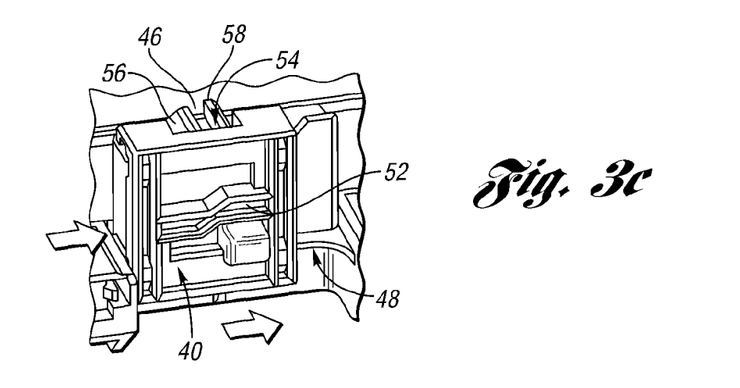
Figure 3D:
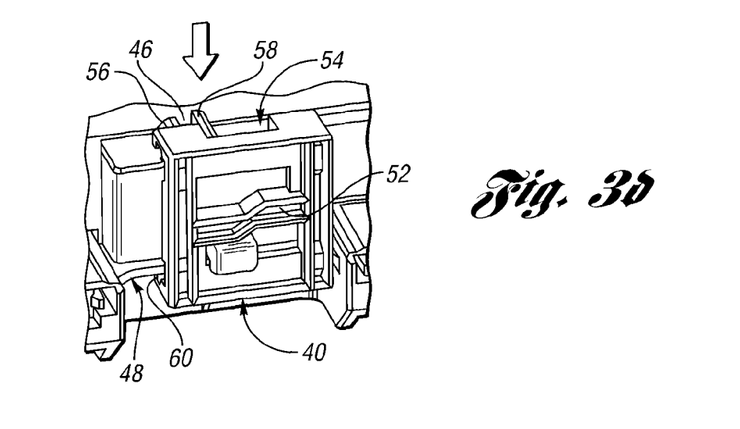

The slide clip 40 removably secures the bottom housing portion 32 to the rectifier 36 by fitting over a clip 46 and protrusion on the housing 30 and a lip 48 on the rectifier 36 (see FIG. 3b). Once the slide clip 40 is properly positioned relative to the housing 30 and rectifier 36, it can be slid lateral to cause an angled, cross member 52 to generate a blocking fit as the slide clip 40 continues to move rightward (see movement from FIG. 3c to FIG. 3d). During the rightward movement a top opening 54 in the slide clip 40 engages the housing clip 46 until a lever 56 of the housing clip engages a relief (not shown) on the underside of slide clip 40. The housing clip 46 is shown to include a stopper 58 that projects through the top opening 54 to prevent further rightward travel of the slide clip 40. A bottom lip 60 of the slide clip 40 engages with the inverter lip 48 to complete the compressive fit. The fastening provided by the slide clips 38, 40, 42 may operate with fasteners 62, 64, 66, 68 used to mount to electronics unit 16' to a vehicle structure (not shown), such as but not limited to a cooling plate.

Figure 4:
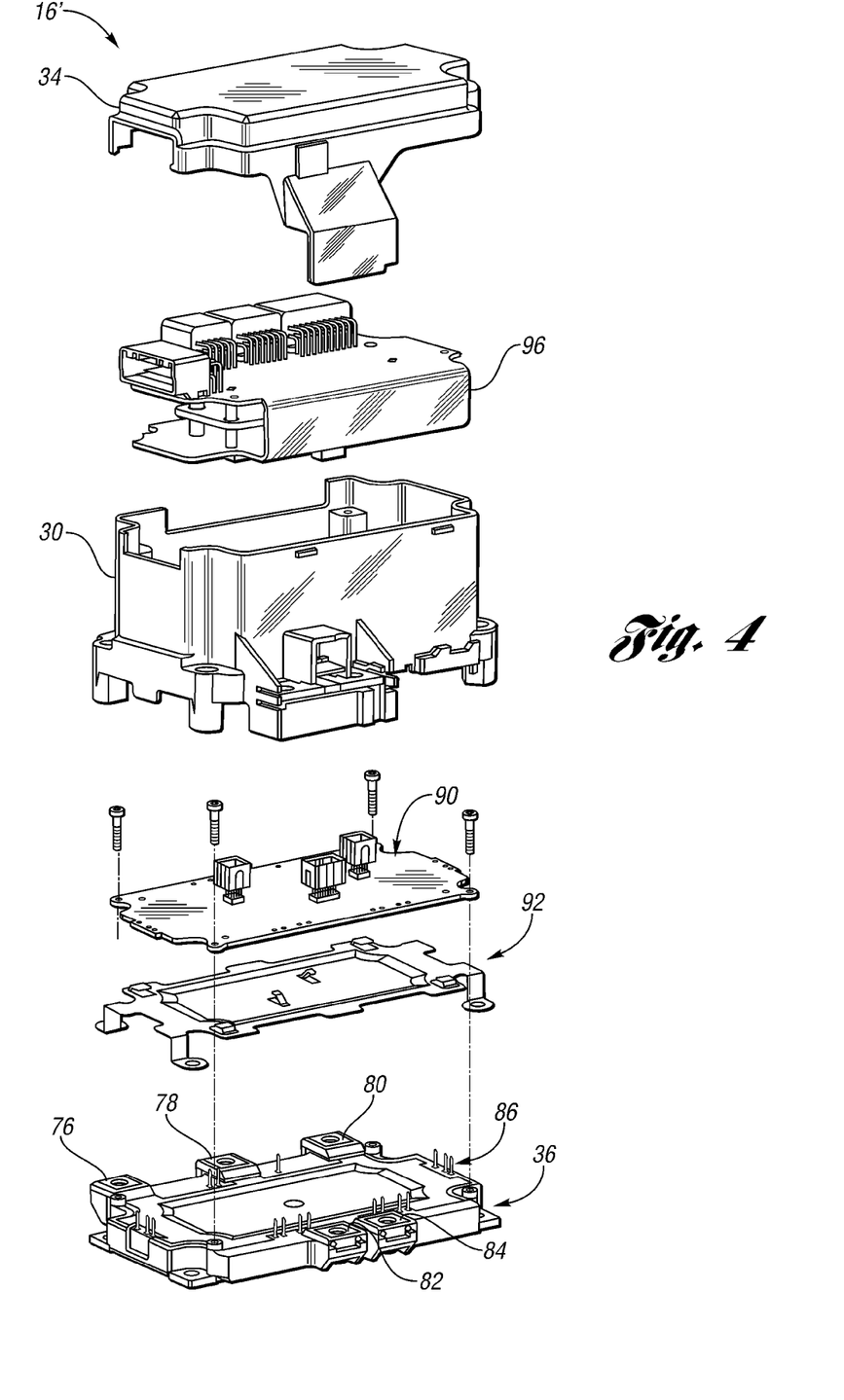

FIG. 4 illustrates a partial assembly view of the electronics unit 16'. The rectifier 36 includes first, second, and third input terminals 76, 78, 80 and first and second output terminals 82, 84 where each is operable to establish an electrical connection within a corresponding one of the busbars 20, 22, 24, 26, 28. The rectifier 36 may include a number of switches (not shown) arranged into a rectifier circuit (not shown) and a rectifier controller (not shown) operable to control the opening and closing of the switches to achieve the AC-DC inversion and/or other energy/power management operations necessary to process the inputted energy for output to the battery as contemplated by the present invention. The rectifier 36 may correspond with the inverter referred to in the application as a electronics unit described in U.S. patent application Ser. No. 12/786,607 filed May 25, 2010, entitle Electronics unit With Current Sensing, the disclosure of which is hereby incorporated in its entirety by reference.

The rectifier 36 may include a plurality of electrical connection tabs 86 or other features to facilitate establishing electrical connections with a first printed circuit board (PCB) 90. The connections may be used to facilitate electrical control, information message, etc. The first PCB 90 may include electronics operable, as described below in more detail, to facilitate a plurality of power management capabilities of the electronics unit 16', including having electronics operable to control the switching operations of the rectifier 36. Optionally, the PCB 90 may be used in place of the inverter controller to control the rectifier circuit. A shield plate 92 is shown to be disposed between the rectifier 36 and the first PCB 90. The shield plate 92 may be comprised of a metallic material or other material sufficient to prevent or ameliorate electrical interferences, such as those resulting from the inverter switching operations, from being imparted the first PCB 90 and/or other portions of the housing 30. The shield 92 is shown to substantially cover the entire footprint of the housing 30 to help maximize the desired magnetic shielding.

A second, multi-layered PCB 96, optionally having a supporting structure, is shown to be included within the electronics unit 16'. The second PCB 96 may operate in conjunction with the first PCB 90 to facilitate managing power distribution, informing/instruction vehicle subsystems relying on battery charging or otherwise associated therewith, and/or to perform any number of other operations. Some of the management operations contemplated by the present invention may include:

Management of battery charging (regulation strategy of how current is delivered to the battery). Since current and voltage in the battery 12 may vary depending on battery charge, age and system demands, this management may include adapting the battery charge working point as a function thereof.

Power conversion (higher level control of electronics unit and option other vehicle subsystems during battery charging). This management may include adapting to different battery status (voltage and current levels) and from different power grids (mono-phase, three-phase, stable or not . . . ).

Plug detection and status (confirming proper connection of cord to vehicle receptacle, such as in response to proximity detection circuit output/message). This management may include ensuring the charging system 10 is right and safe (to car, to users . . . ) prior to any charging.

Management of plug locking (ensuring plug properly locked). This management may include controlling opening of the cord plug while charging; avoiding connections into another car, i.e., preventing charging of two vehicle—separate charging for separate payments; and communications with the power grid for payments Management of system and peripherals auto diagnostics (sensors and actuators) to ensure safer before charging.

Detection of the supply network characteristics (the residential power grid and making adjustments as necessary based thereon, communication with grid for payment, for grid type and power availability; earth safety connection detection).

Management of the Power Electronics Box (PEB—unit with the switches to open or close the charging path, or to by-pass the charger in case of direct DC charging) during the charge (the charging system).

Monitoring and management of the temperature since cooling is critical while charging and thus to control temperature evolution as the electronics unit 16 may experience loses, that although small (less than 5%), that are important to manage when multiple kilowatts are being transferred.

Management of interlocks (detection of all system connectors closed) to control opening of a connector when energy is flowing generates so that the system 10 can be down in the event of a premature opening.

Management of over/under voltages and current to protect the system 10 during the charging process so that the system 10 can be shutdown.

Management of sensor information acquisition and shaping.

Management of the internal power supply for controlling and driving electronics.

Communication with the EVC (other vehicle unit with master control) and other digital communications with the vehicle to inform of charging process and receive vehicle commands.

Figure 5A:
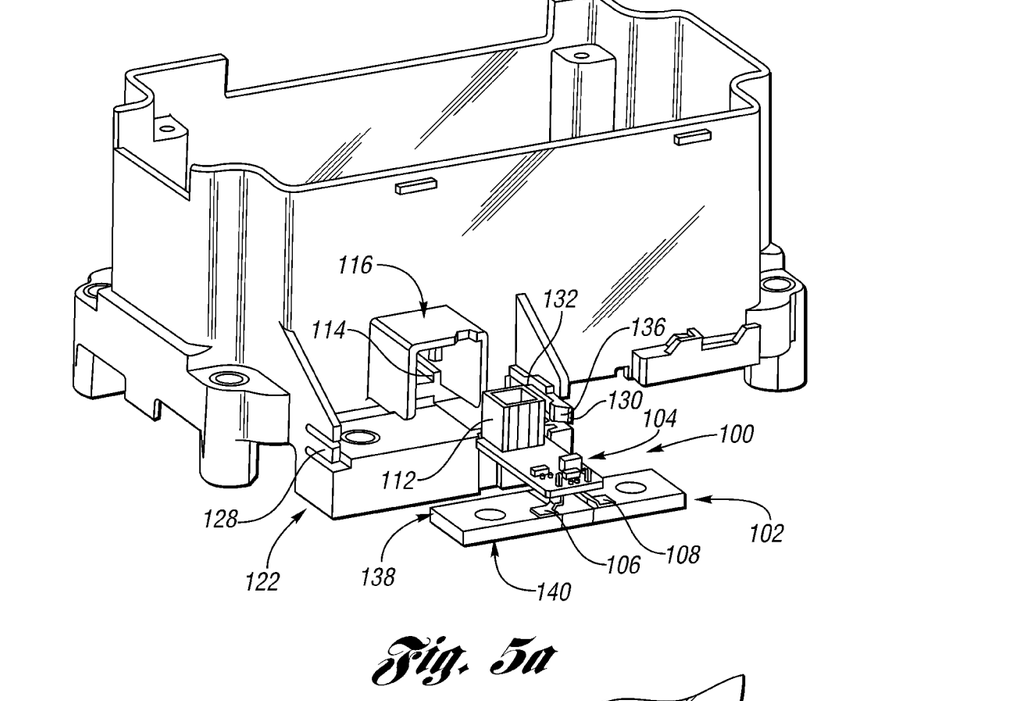
FIGS. 5a-5b illustrate a current sensor contemplated by one non-limiting aspect of the present invention.
Figure 5B:
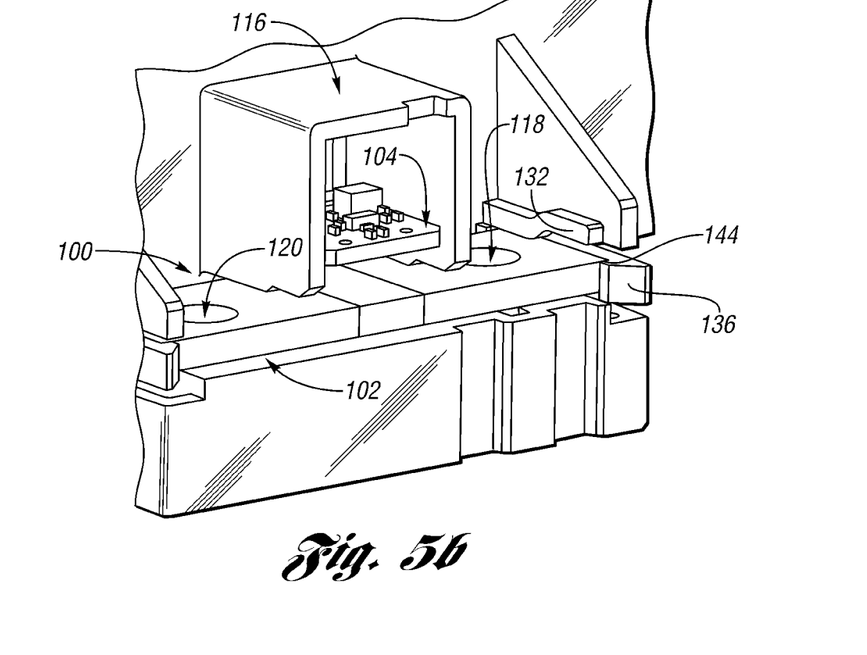

One non-limiting aspect of the present invention contemplates measuring current of the DC output to facilitate the energy management noted above. Because the battery 12 is described with respect to being used within an electric or hybrid electric vehicle, it is contemplated that the battery is a relatively high voltage battery that requires a relative high amount of charging current. FIGS. 5a-5b illustrate a robust current sensor 100 contemplated by one non-limiting aspect of the present invention to measure the DC current output. The current sensor 100 includes a shunt 102 and a current measurement PCB 104 having electronics operable to determine the DC output current based on a voltage differential detected between first and second pins 106, 108 used to supportively space the measurement PCB 104 away from the shunt 102. The pins 106, 108 may include pads to facilitate being soldered to the shunt 102. The shunt 102 may be comprised of multiple materials, such as copper and manganin (used to measure voltage differential). A connector 112 may be included at one of the PCB 104 to facilitate connecting to electronics included within the housing 30. The housing 30 may include an aperture 114 and shroud 116 to facilitate positioning the connector 112 within a housing interior.

The shunt 102 may include one end positioned relative to the first output terminal 82 and a second end positioned relative to the second output busbar 28. Apertures 118, 120 may be included at each end to facilitate threaded fasteners being used to established mechanical and electrical connections therebetween such as to be used in place of welding, although welding is contemplated. The housing 30 may include a terraced-shape outcropping 122 to support an underside of the shunt 102. The housing 30 may also include first and second opposed tangs 128, 130 to facilitate securing positioning of the shunt 102 and optional guide surfaces 132 (only one shown) to facilitate aligning the shunt during insertion. The tangs 128, 130 may each include an angled engagement surface 136 operable with a leading edge 138 of the shunt 102 to cause each tang 128, 130 to flex outwardly during shunt insertion until a trailing edge 140 of the shunt 102 surpasses an end of the angled engagement surface 136. A securement surface 144 on the backside of the angled engagement surface 136 comes into contact with the trailing edge 140 of the shunt 102 once the trailing edge 140 surpasses an end of the angled engagement surface 136. The length of each tang 128, 130 may be select such that the securement surface 144 is sufficiently positioned relative to the trailing edge 140 of the shunt to generate an interference fit with the side of the housing 30.

Figure 6:
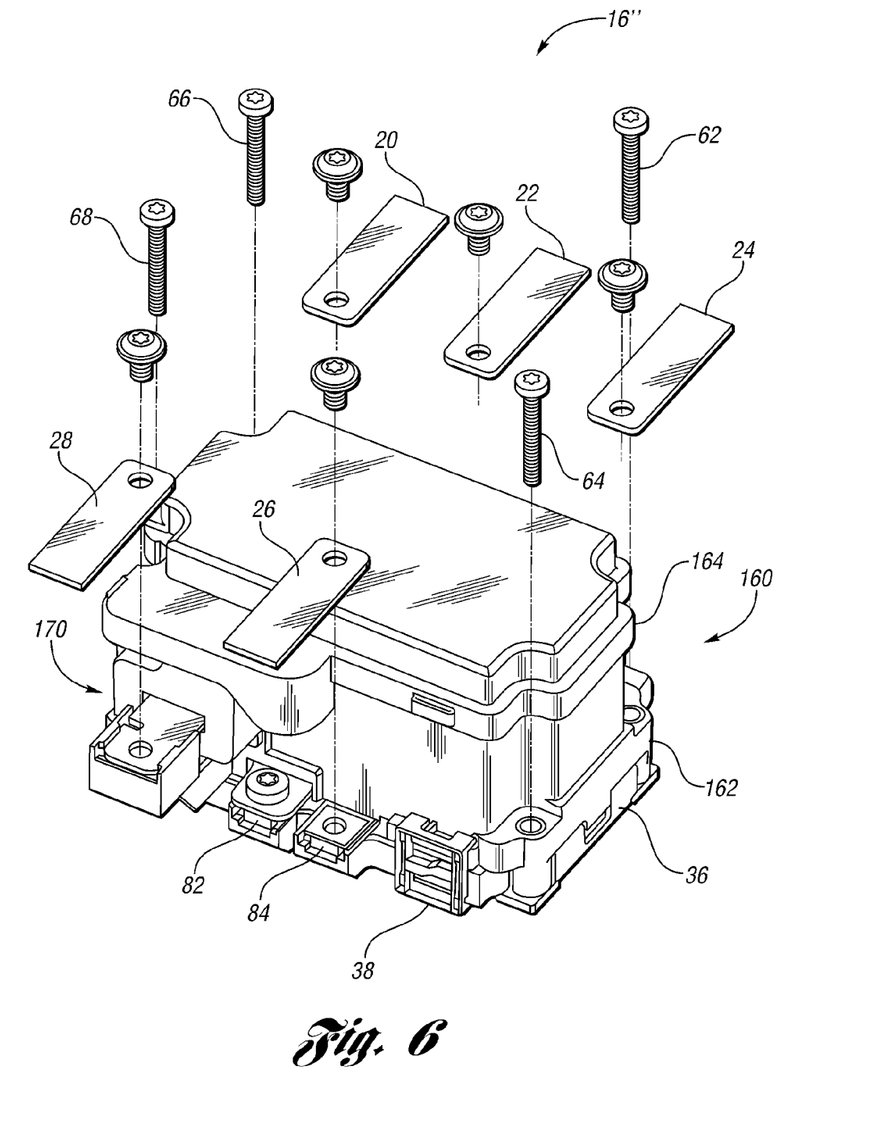
FIG. 6 illustrates a electronics unit contemplated by one non-limiting aspect of the present invention.
Figure 7A:
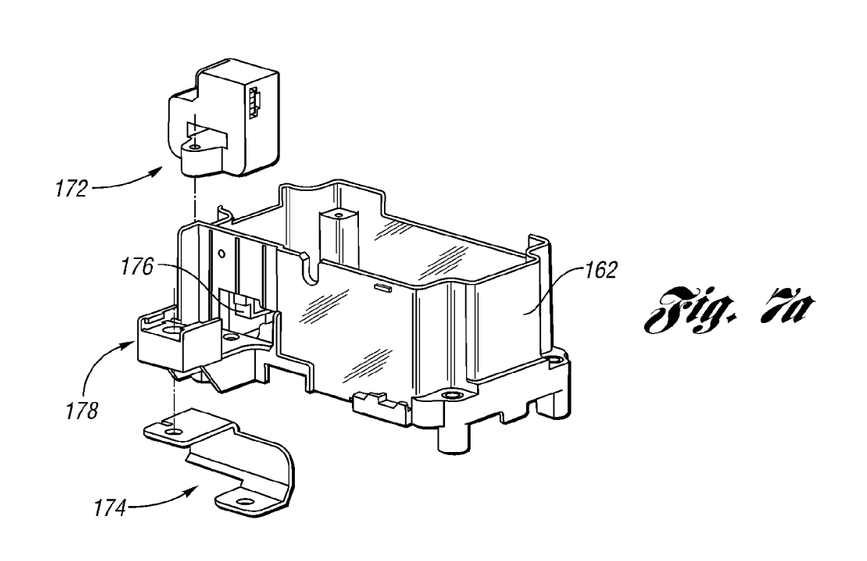
FIGS. 7a-7b illustrate a partial assembly view of the electronics unit.
Figure 7B:
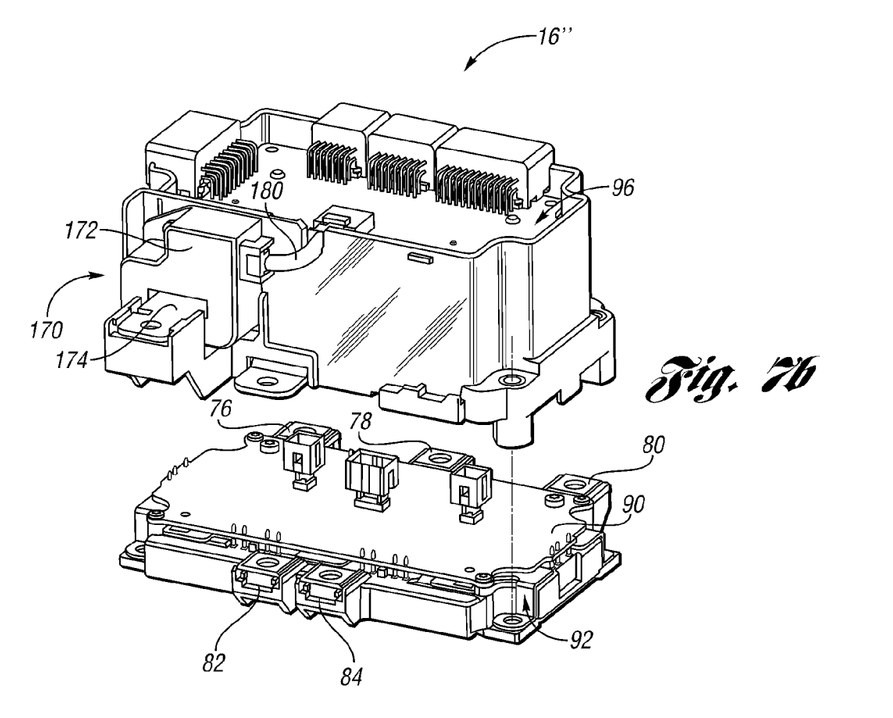

FIG. 6 and FIGS. 7a-7b illustrate a electronics unit 16" as contemplated by one non-limiting aspect of the present invention to process three-phase AC, received through first, second, and third input busbars 20, 22, 24 to an DC output carried by first and second output busbars 26, 28 to the battery 12 or other vehicle load. The electronics unit 16" includes a housing 160 shown to be comprised of first and second portions 162, 164. The first portion 162 generally defines a footprint and side walls and the second portion 164 generally defines a cap or lid that fits over the first portion 162 to enclose the electronics and other items therein. The housing 160 is shown to be attached proximate a bottom of the first portion 162 to the rectifier 36 described above with the plurality of slide clips 38, 40, 42. The electronics unit 16" may include some of the electronics included in the electronics unit 16' described above and operable to perform so or all of the same functions.

A current sensor 170 of the electronics unit 16" shown in FIG. 6 is different from the current sensor 100 described above. This current sensor 170 is shown to include a hall effect sensor 172 and a c-shaped shunt 174 (see FIG. 7a), which unlike the shunt 28 described above may be a simple conductive plate (negligible resistance and comprised of singular material, e.g., copper), similar to the busbars 20, 22, 24, 26. The housing 162 is correspondingly modified to include an aperture 176 and terrace-shaped projection 178 for supporting a bottom side of the hall effect sensor 172 and the shunt 174. The shunt 174 is shown to be connected between the first output terminal 82 and the second output busbar 28 to facilitate determining the output DC current. The hall effect sensor 172 may include a hollow center through which a portion of the shunt 174 passes to facilitate the current measurement. A flexible wire 180 may be included to facilitate electrically connecting the hall effect sensor 172 to one of the PCBs 96 to support the current feedback required to support the operations noted above.

As supported above, one type of electronics unit contemplated by the present invention may be assembled according to an "assembly-on-top" construction where each element is built on top of the inverter and removably attached to each other. This results in an integrated, bigger housing of the electronics unit that will provide a cooling system for the electronics and other elements inside the electronics unit housing. For this reason, the present invention is able to provide cooling surfaces while allowing for building up of the module in a sequential process where some elements (e.g., PCBs) may be added after the partial assembly is constructed and shipped to a customer. The present invention further contemplates the electronics unit being bi-directional, at least in that it has the capability to send energy from a vehicle battery to a power grid (grid equalization . . . ), then in said functionality the rectifier may turn into an inverter (the energy would flow counter-wise and thus the controlling strategy, in software, would be different). Of course a bi-directional system must comply more requirements than a mono-directional rectifier and the silicon inside would need to improve.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

While exemplary embodiments are described above, it is not intended that these embodiments describe all possible forms of the invention. Rather, the words used in the specification are words of description rather than limitation, and it is understood that various changes may be made without departing from the spirit and scope of the invention, such as to support energy manipulation, rectification, inversion, etc. in non-vehicle or automotive applications. Additionally, the features of various implementing embodiments may be combined to form further embodiments of the invention.

What is claimed is:

1. An electronics unit operable for use within a vehicle to rectify a three-phase, AC input to a DC output, the electronics unit comprising:
    an assembly having:
        i. conducting first, second, and third input terminals each operable to establish an electrical connection to one of three input busbars carrying the AC input;
        ii. conducting first and second output terminals each operable to establish an electrical connection to one of two first and second output busbars carrying the DC output;
        iii. a rectifier disposed between the input terminals and the output terminals, the rectifier having a plurality of switches operably connected between the input terminals and the output terminals to rectify the three-phase AC input to the DC output;
    a shunt operatively coupled between the first output terminal and the first output busbar;
    a current sensor operable to determine a current through the shunt;
    at least one printed circuit board (PCB) having control electronics operable to manage power distribution between the electronics unit and one or more vehicle subsystems based at least in part on the current measured by the current sensor; and
    a housing shaped to substantially enclose the assembly and each of the at least one PCB, the housing having a projection extending therefrom configured to supportively engage the shunt exterior to the housing.

2. The electronics unit of claim 1 wherein the housing is shaped to expose an area around each of the terminals to facilitate connection to the shunt and busbars.

3. The electronics unit of claim 2 wherein the current sensor is removably attached to the housing.

4. The electronics unit of claim 2 wherein the shunt includes a first and second ends, the voltage drop being measured between the first and second end and each of the first and second being positioned outside of the housing.

5. The electronics unit of claim 4 wherein a portion of the shunt extending between the first and second ends is substantially positioned exterior to the housing.

6. The electronics unit of claim 4 wherein a portion of the shunt extending between the first and second ends is substantially positioned interior to the housing.

7. The electronics unit of claim 2 wherein the housing is removably engaged to the assembly with a plurality of slide clips to provide a modular, assembly-on-top construction.

8. The electronics unit of claim 7 wherein the housing includes a protrusion and the assembly includes a lip, each lip and clip being arranged to slide laterally proximate to a corresponding side of the housing to engage the protrusion and the lip.

9. The electronics unit of claim 1 wherein the shunt is removably connected to the first output terminal.

10. The electronics unit of claim 1 wherein the shunt is planar.

11. The electronics unit of claim 1 wherein the shunt is c-shaped.

12. The electronics unit of claim 1 wherein the current sensor includes a hall effect sensor being connected to one of the at least one PCB with a flexible wire, the flexible wire extending from an interior of the housing through an aperture to an exterior of the housing, the flexible wire being connected to the current sensor at the exterior of the housing.

13. The electronics unit of claim 1 wherein the current sensor includes one or more measurement electronics operable to determine the current based on a voltage drop between first and second pins, the first and second pins being respectively adhered to first and second portions of the shunt for supporting the measurement PCB to be spaced apart from the shunt.

14. The electronics unit of claim 1 further comprising a shield layer for separating the at least one PCB from the rectifier, the shield layer being comprised of a metallic material and shaped to extend across substantially an entire footprint of the assembly.

15. An electronics unit operable for use within a vehicle to manage power of a battery, the electronics unit comprising:
   a rectifier operable to rectify an AC input to a DC output for charging the battery;
   a current sensor having:
      i. a shunt including a first portion and a second portion, the shunt being positioned between the DC output and the battery;
      ii. a measurement circuit operable to measure a current through the shunt as a function a voltage drop measured between the first portion and the second portion of the shunt; and
   at least one printed circuit board (PCB) having control electronics operable to manage DC output based at least in part on the measured current; and
   a housing enclosing the rectifier and the at least one PCB, the housing including first and second opposed and flexible tangs extending therefrom, the first and second tangs being configured to removably position the shunt between the DC output and the battery, the housing having a projection extending therefrom adjacent the flexible tangs, the projection configured to supportively engage the shunt exterior to the housing.

16. The electronics unit of claim 15 wherein each tang includes an angled engagement surface that induces each tang to flex outwardly during shunt insertion until a trailing end of the shunt passes an end of the angled surface whereupon each tang at least partially un-flexes such that a securement surface engages with the trailing end of the shunt to position the shunt between the DC output and the battery.

17. The electronics unit of claim 16 wherein each tang extends away from the housing at a length sufficient to generate an interference fit between each securement surface and the housing.

18. The electronics unit of claim 16 wherein the shunt is planar throughout and at least twice as long as an aperture included therein to mechanically connect to a busbar used to facilitate electrically connecting to the battery.

19. An electronics unit operable for use within a vehicle to manage a battery, the electronics unit comprising:
   a rectifier operable to rectify an AC input to a DC output used to charge the battery;
   a current sensor having:
      i. a shunt electrically connected between the DC output and the battery;
      ii. a hall effect sensor operable to measure a current through the shunt as a function a voltage drop measured between a first portion and a second portion of the shunt; and
   a housing enclosing the rectifier and having a terrace-shaped structure extending therefrom, the terrace-shaped structure configured to supportively engage an underside of the hall effect sensor and one end of the shunt exterior to the housing proximate the hall effect sensor.

20. The electronics unit of claim 19 wherein the one end of the shunt proximate the hall effect sensor is spaced vertically apart from another end of the shunt connected proximate the rectifier.

* * * * *

UNITED STATES PATENT AND TRADEMARK OFFICE
CERTIFICATE OF CORRECTION

Page 1 of 1

PATENT NO. : 8,878,483 B2
APPLICATION NO. : 13/006569
DATED : November 4, 2014
INVENTOR(S) : Yann Darroman et al.

It is certified that error appears in the above-identified patent and that said Letters Patent is hereby corrected as shown below:

In the Claims,

Column 7, Line 20, Claim 15:

After "through the shunt as a function"
Insert -- of --.

Signed and Sealed this
Seventeenth Day of February, 2015

Michelle K. Lee
*Deputy Director of the United States Patent and Trademark Office*